(12) United States Patent
Han et al.

(10) Patent No.: US 8,853,694 B2
(45) Date of Patent: Oct. 7, 2014

(54) CHIP ON FILM PACKAGE INCLUDING TEST PADS AND SEMICONDUCTOR DEVICES INCLUDING THE SAME

(71) Applicant: Samsung Electronics Co., Ltd., Suwon-si (KR)

(72) Inventors: Sang-Uk Han, Hwaseong-si (KR); Jeong-Kyu Ha, Hwaseong-si (KR); Young-Shin Kwon, Osan-si (KR); Seung-Hwan Kim, Hwaseong-si (KR); Kwan-Jai Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/669,031

(22) Filed: Nov. 5, 2012

(65) Prior Publication Data

US 2013/0175528 A1    Jul. 11, 2013

(30) Foreign Application Priority Data

Jan. 9, 2012 (KR) .................. 10-2012-0002522

(51) Int. Cl.
  H01L 23/58    (2006.01)
  H01L 23/498   (2006.01)
  H01L 23/495   (2006.01)
  H01L 21/66    (2006.01)
  H01L 23/14    (2006.01)

(52) U.S. Cl.
  CPC ......... *H01L 23/49524* (2013.01); *H01L 23/145* (2013.01); *H01L 23/4985* (2013.01); *H01L 23/49827* (2013.01); *H01L 23/49838* (2013.01); *H01L 22/32* (2013.01)
  USPC ............ 257/48; 257/668; 257/693; 257/698; 257/774; 257/E23.007; 257/E23.034; 257/E23.046; 257/E23.055; 257/E23.065; 257/E23.067; 438/14; 438/15; 438/125

(58) Field of Classification Search
  None
  See application file for complete search history.

(56) References Cited

U.S. PATENT DOCUMENTS

| 5,334,857 | A  | * | 8/1994  | Mennitt et al. ................ 257/48  |
| 5,731,630 | A  | * | 3/1998  | Suyama et al. ............... 257/701 |
| 5,796,163 | A  | * | 8/1998  | Glenn et al. .................. 257/698 |
| 7,420,270 | B2 | * | 9/2008  | Lee et al. ...................... 257/691 |
| 7,459,779 | B2 | * | 12/2008 | Chung et al. .................. 257/692 |
| 7,683,471 | B2 | * | 3/2010  | Chung et al. .................. 257/688 |
| 2004/0245628 | A1 | * | 12/2004 | Chung .......................... 257/734 |

(Continued)

FOREIGN PATENT DOCUMENTS

| CN | 102625581 A | * | 8/2012 |
| JP | 06-260799   |   | 9/1994 |
| JP | 2002-164633 |   | 11/2000 |
| KR | 20-1992-0013724 |   | 7/1992 |

*Primary Examiner* — Julio J Maldonado
*Assistant Examiner* — Molly Reida
(74) *Attorney, Agent, or Firm* — Myers Bigel Sibley & Sajovec, PA (57) ABSTRACT

Provided are a chip on film (COF) package and semiconductor having the same. The COF package can include a flexible film having first and second surfaces opposite to and facing each other and including a conductive via penetrating from the first surface to the second surface, first and second conductive patterns respectively is on the first surface and the second surface and electrically connected to each other through the conductive via, an integrated circuit (IC) chip is on the first surface and electrically connected to the first conductive pattern, a test pad overlaps the conductive via and is electrically connected to at least one of the first conductive pattern and the second conductive pattern, and an external connection pattern is on the second surface spaced apart from the conductive via and electrically connected to the second conductive pattern.

11 Claims, 9 Drawing Sheets

(56) References Cited

U.S. PATENT DOCUMENTS

| | | | |
|---|---|---|---|
| 2005/0046033 A1* | 3/2005 | Chung et al. | 257/774 |
| 2005/0252682 A1* | 11/2005 | Shimoto et al. | 174/260 |
| 2006/0283625 A1* | 12/2006 | Yamamichi et al. | 174/255 |
| 2007/0152329 A1* | 7/2007 | Cho et al. | 257/734 |
| 2007/0200246 A1* | 8/2007 | Huang et al. | 257/774 |
| 2008/0081455 A1* | 4/2008 | Yu et al. | 438/612 |
| 2008/0303148 A1* | 12/2008 | Chung et al. | 257/737 |
| 2011/0133315 A1* | 6/2011 | Pahl et al. | 257/659 |

\* cited by examiner

CHIP ON FILM PACKAGE INCLUDING TEST PADS AND SEMICONDUCTOR DEVICES INCLUDING THE SAME

CROSS-REFERENCE TO RELATED APPLICATION

This application claims priority from Korean Patent Application No. 10-2012-0002522 filed on Jan. 9, 2012 in the Korean Intellectual Property Office, and all the benefits accruing therefrom under 35 U.S.C. 119, the contents of which in its entirety are herein incorporated by reference.

BACKGROUND

1. Field of the Inventive Concept

The present inventive concept relates to a chip on film (COF) package and semiconductor having the same.

2. Description of the Related Art

Along with the widespread use of a flexible panel, a chip on film (COF) package is increasingly used, instead of a chip on glass (COG) package involving a problem of IC cracks. However, if a 1-layer COF package having a conductive layer formed only on one surface of the COF package is combined with a flexible panel, the overall thickness of a semiconductor device may become thicker. Therefore, in order to reduce the thickness of a semiconductor device, a 2-layer COF package having conductive layers formed on both surfaces of the COF package is developed when the COF package is combined with the flexible panel.

However, a test pad is used to perform a final test on the COF package. The test pad is not formed on an active region having the COF package formed therein but is formed on a peripheral region (or a test region) located at the periphery of the active region. The peripheral region may be cut for removal in forming an end product of the COF package. Therefore, in order to save the production cost, unused portions of the peripheral region are removed.

SUMMARY

According to an aspect of the present inventive concept, there is provided a chip on film (COF) package that can include a flexible film having first and second surfaces opposite to and facing each other and including a conductive via penetrating from the first surface to the second surface. First and second conductive patterns respectively can be on the first surface and the second surface and can be electrically connected to each other through the conductive via. An integrated circuit (IC) chip can be on the first surface and is electrically connected to the first conductive pattern. A test pad can overlap the conductive via and can be electrically connected to at least one of the first conductive pattern and the second conductive pattern. An external connection pattern can be on the second surface spaced apart from the conductive via and electrically connected to the second conductive pattern.

According to another aspect of the present inventive concept, there is provided a semiconductor device including a panel, and a chip on film (COF) package including a flexible film having first and second surfaces opposite to and facing each other and including a conductive via penetrating from the first surface to the second surface. First and second conductive patterns respectively can be on the first surface and the second surface and can be electrically connected to each other through the conductive via. An integrated circuit (IC) chip can be on the first surface and can be electrically connected to the first conductive pattern. A test pad can overlap the conductive via and can be electrically connected to at least one of the first conductive pattern and the second conductive pattern. An external connection pattern can be on the second surface spaced apart from the conductive via and electrically connected to the second conductive pattern, wherein one surface of the panel can contact a portion of the second surface of the COF package, and the COF package can be electrically connected to the panel through the external connection pattern.

According to another aspect of the present inventive concept, there is provided a chip on film (COF) package, which may include a singulated flexible film having first and second opposing surfaces with respective first and second conductive patterns thereon with conductive via and a test pad included in an active region of the singulated flexible film between directly adjacent cutting lines for the singulated flexible film. The conductive via may overlap the test pad, and the package may include an external connection pattern on the singulated flexible film spaced apart from the conductive via and electrically connected to at least one of the first and second conductive patterns. The external connection pattern and the test pad may be on the first and second conductive patterns, respectively. The external connection pattern and the test pad may both be located on the first or second conductive pattern. The conductive via may be non-overlapping the test pad, and the package may further include an external connection pattern on the singulated flexible film spaced apart from the conductive via and electrically connected to at least one of the first and second conductive patterns, where the external connection pattern and the test pad may be on the first and second conductive patterns, respectively.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF THE EMBODIMENTS

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
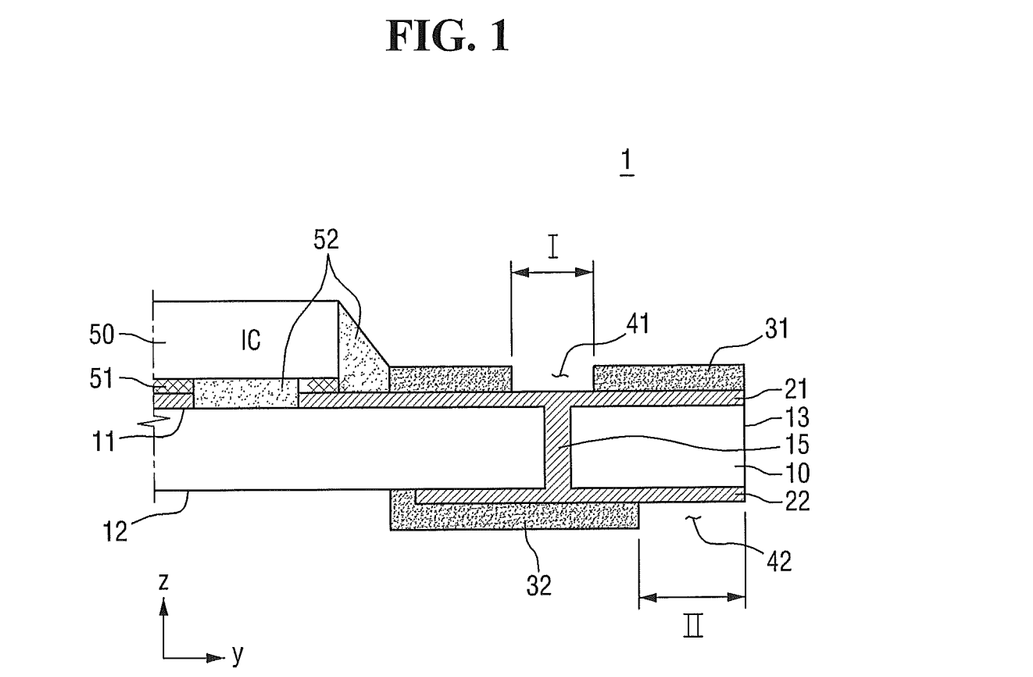
FIG. 1 is a cross-sectional view of a COF package according to a first embodiment of the present inventive concept.

Hereinafter, a COF package according to a first embodiment of the present inventive concept will be described with reference to FIGS. 1 to 4. FIG. 1 is a cross-sectional view of a COF package according to a first embodiment of the present inventive concept, FIG. 2 is a plan view of the COF package shown in FIG. 1, FIG. 3 is a bottom view of the COF package shown in FIG. 1, and FIG. 4 is a plan view illustrating a state in which the COF package is yet to be cut by unit (i.e., singulated or separated from one another).

Figure 2:
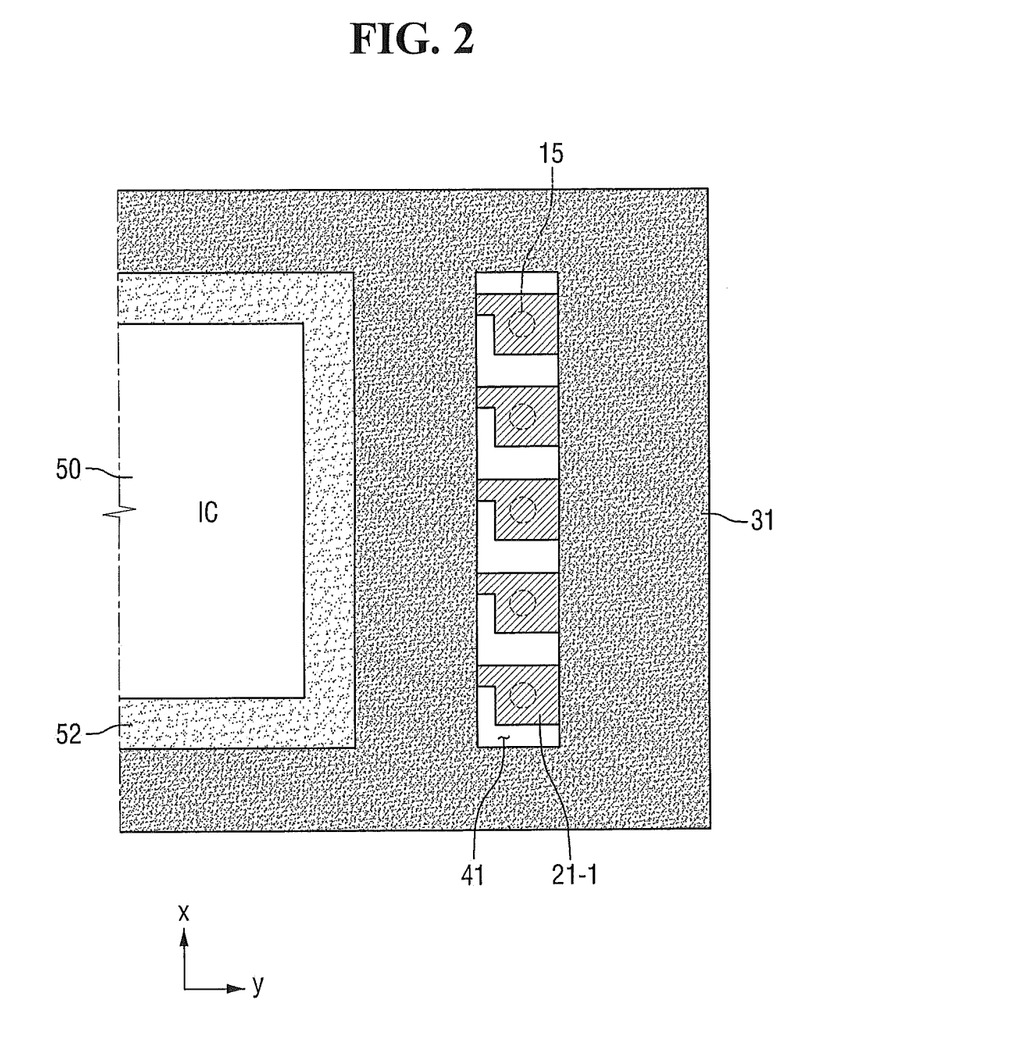
FIG. 2 is a plan view of the COF package shown in FIG. 1.
Figure 3:
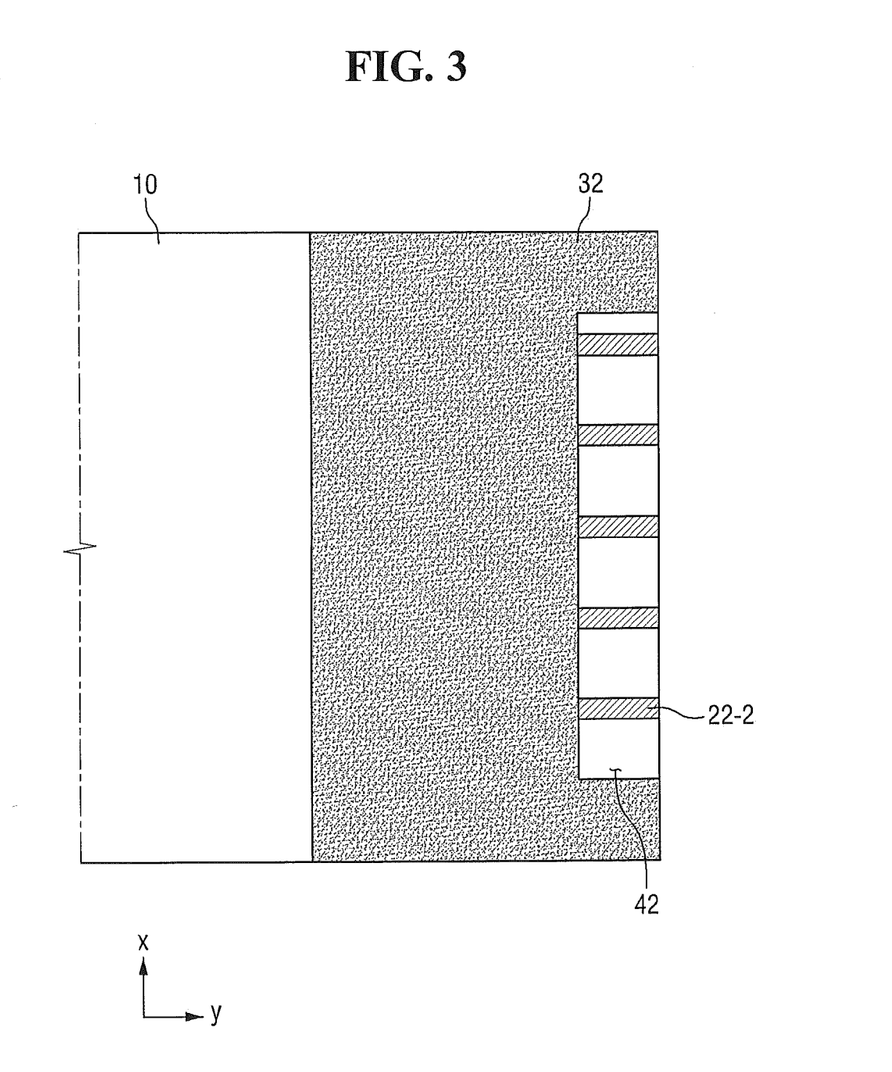
FIG. 3 is a bottom view of the COF package shown in FIG. 1.
Figure 4:
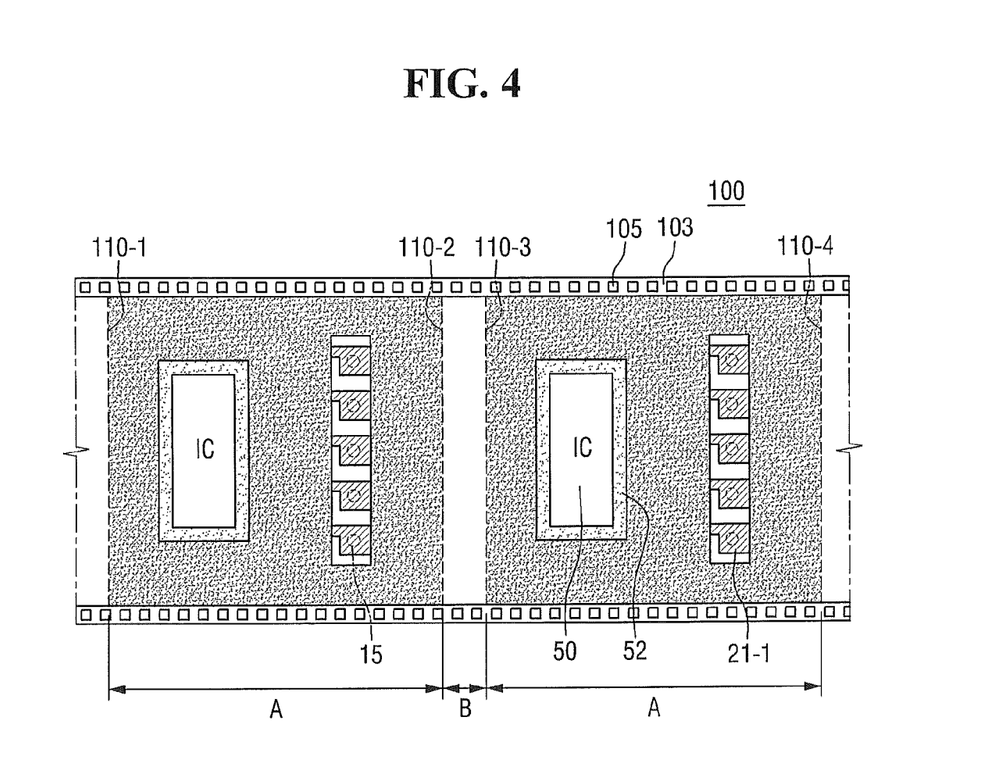
FIG. 4 is a plan view illustrating a state in which the COF package is yet to be cut by unit.

Referring to FIGS. 1 to 3, the COF package 1 includes a flexible film 10, first and second conductive patterns 21 and 22, an IC chip 50, a first test pad 21-1, and an external connection pattern 22-2.

The flexible film 10 has a first surface 11 and a second surface 12 opposite to and facing each other. The first surface 11 may be defined as a surface on which the IC chip 50 is formed, and the second surface 12 may be defined as a surface opposite to and facing the surface on which the IC chip 50. One surface of the flexible film 10 may be a cut surface 13, which is cut along cutting lines 110-1 to 110-4 in a subsequent cutting process of a COF roll (100 of FIG. 4).

The flexible film 10 may include a conductive via 15 penetrating from the first surface 11 to the second surface 12. The conductive via 15 may be filled with a conductive material, for example, copper (Cu), but not limited thereto.

Figure 5:
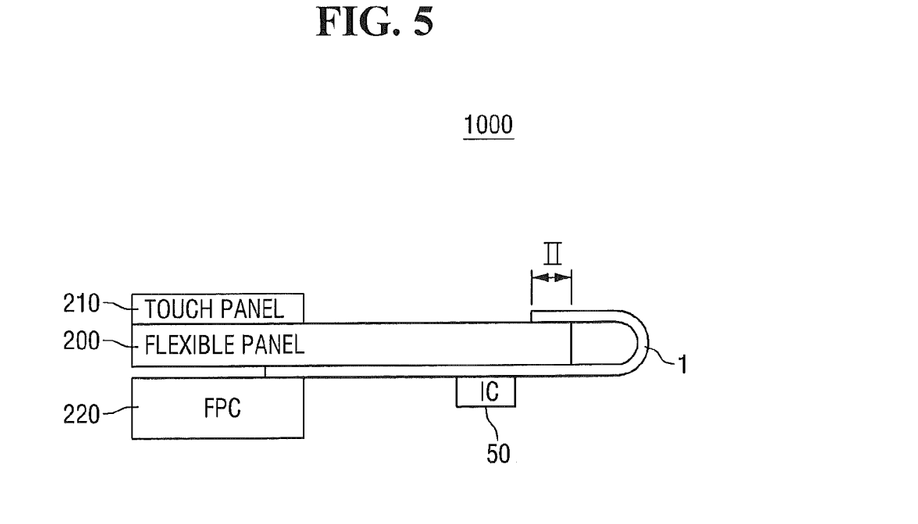
FIG. 5 is a cross-sectional view of a semiconductor device according to a first embodiment of the present inventive concept.
Figure 6:
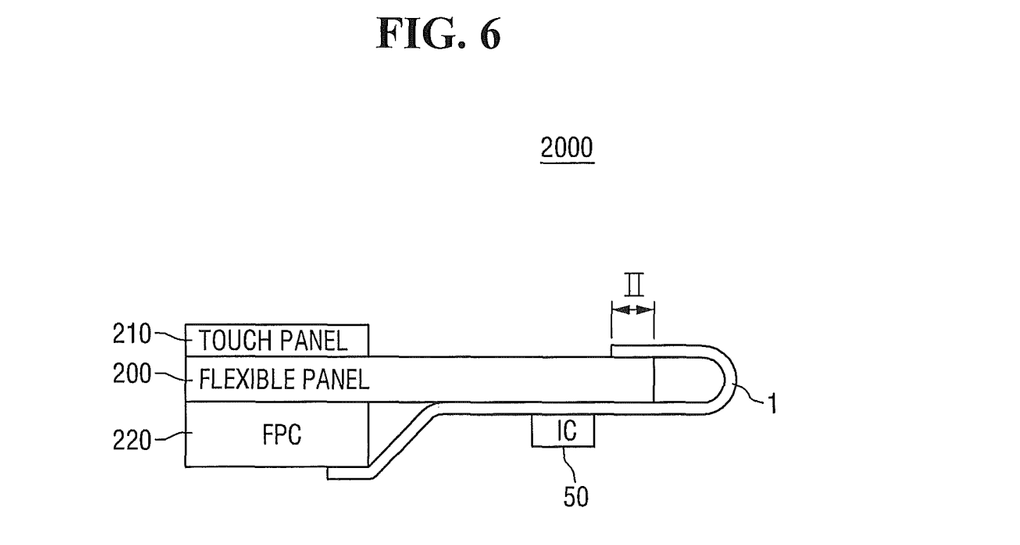
FIG. 6 is a cross-sectional view of a semiconductor device according to a second embodiment of the present inventive concept.

Referring to FIGS. 5 and 6, since a portion of the COF package 1 is bent to be used, the flexible film 10 is made of a flexible material.

The flexible film 10 can be formed of many different materials that can be arranged to provide the desired electrical isolation and high thermal conductivity. In some embodiments, the can at least partially comprise a dielectric to provide the desired electrical isolation. The flexible films 10 can be made of materials such a polyimides and polyesters, (sometimes referred to as a flexible printed circuit board). This can allow the board to take a non-planar or curved shape, with the circuits thereon also being arranged in a non-planar manner. In some embodiments according to the inventive concept, the board can be a flexible printed substrate such as a Kapton® polyimide available from Dupont.

The COF package 1 may be a 2-layer COF package having conductive layers formed on both surfaces of the COF package 1. In detail, first and second conductive patterns 21 and 22 are formed on the first surface 11 and the second surface 12 of the flexible film 10, respectively. The first and second conductive patterns 21 and 22 may be made of, for example, copper (Cu), but not limited thereto. The first conductive pattern 21 and the second conductive pattern 22 may be electrically connected to each other through the conductive via 15.

The IC chip 50 may be formed on the first surface 11 of the flexible film 10 and may be electrically connected to the first conductive pattern 21. In detail, the IC chip 50 may be electrically connected to the first conductive pattern 21 through a bump 51. The bump 51 may be made of, for example, gold (Au), but not limited thereto.

The IC chip 50 may be fixed on the first surface 11 of the flexible film 10 by a filler 52. In detail, a gap between the IC chip 50 and the flexible film 10 may be filled with the filler 52, and lateral surfaces of the IC chip 50 may also be covered by the filler 52. The filler 52 may be a resin, but not limited thereto.

Referring to FIGS. 1 and 2, a first test pad 21-1 may be formed on the first surface 11 of the flexible film 10 to overlap the conductive via 15. That is to say, the first test pad 21-1 may be formed on the conductive via 15 while overlapping the conductive via 15. The first test pad 21-1 may be electrically connected to the first conductive pattern 21. The first test pad 21-1 may be used when the COF package 1 is subjected to a final test. It will be understood that the term "overlapping" includes arrangements where the conductive via 15 and the first test pad 21-1 at least partially overlap one another.

In detail, the first test pad 21-1 may be formed on a test pad region (I). In addition, the first test pad 21-1 may be formed to cover the conductive via 15, and a cross-sectional area of the first test pad 21-1 may be larger than that of the conductive via 15. While FIG. 2 illustrates that the first test pad 21-1 is rectangular, the present inventive concept does not limit the shape of the first test pad 21-1 to that illustrated herein The first test pad 21-1 will further be described with reference to FIG. 4.

Referring to FIG. 4, a reel-type COF roll 100 may have an active region (A) and a peripheral region (B). The active region (A) is a portion on which the COF package 1 is formed when the COF roll 100 is cut along cutting lines 110-1 to 110-4. The peripheral region (B) is a portion removed when the COF roll 100 is cut along cutting lines 110-1 to 110-4. In addition, extending regions 103 are formed on opposite sides of the COF roll 100 and the extending regions 103 may include a plurality of holes 105. Since the COF roll 100 is of a reel type, it can be loaded/unloaded to/from a roller. The roller may control the COF roll 100 using the plurality of holes 105 formed in the extending regions 103. However, the extending regions 103 of the COF roll 100 may be removed through the cutting process of the COF roll 100.

The COF package 1 is formed as an end product on the active region (A) of the COF roll 100. As described above, as appreciated by the present inventors, since the peripheral region (B) is finally removed, an area of the peripheral region (B) should be minimized to efficiently utilize the COF roll 100.

In the COF package 1 according to the first embodiment of the present inventive concept, the first test pad 21-1 is not formed in the peripheral region (B) but is formed in the active region (A). In view of the second cutting line 110-2, the active region (A) may be defined as an interior region of the second cutting line 110-2, and the peripheral region (B) may be defined as an exterior region of the second cutting line 110-2. In this case, the first test pad 21-1 may be positioned in the interior region of the second cutting line 110-2. That is to say, since the first test pad 21-1 is formed in the active region (A), which is the interior region of the second cutting line 110-2, it may exist in the end product, that is, the COF package 1 without being removed by the cutting of the COF roll 100.

In the COF package 1 according to the first embodiment of the present inventive concept, since the first test pad 21-1 is not formed at the peripheral region (B), use of the peripheral region (B) can be minimized. Therefore, since the area of the peripheral region (B) is reduced, the production cost can be reduced.

In addition, as described above, since the COF package 1 according to the embodiment of the present inventive concept is a 2-layer COF package, the conductive via 15 electrically connects the first conductive pattern 21 to the second conductive pattern 22. In this case, however, the overall size of the COF package 1 may be increased by an area occupied by the conductive via 15.

However, in the COF package 1 according to the embodiment of the present inventive concept, the first test pad 21-1 may be formed on the first surface 11 of the flexible film 10 so as to overlap the conductive via 15. Since the first test pad 21-1 is formed on the conductive via 15, the area of the conductive via 15 can be efficiently utilized.

That is to say, since the first test pad 21-1 is formed on the active region (A) using a space of the conductive via 15, an increase in the size of the COF package 1 may not be affected by forming the first test pad 21-1 on the active region (A).

Referring to FIGS. 1 and 3, the external connection pattern 22-2 is formed on the second surface 12 of the flexible film 10 and may be electrically connected to the second conductive pattern 22. The COF package 1 may be electrically connected to an external device through the external connection pattern 22-2.

In detail, the external connection pattern 22-2 may be formed in an out lead bonding (OLB) region (II). In addition, the external connection pattern 22-2 may be positioned to be spaced apart from the conductive via 15 and may be formed in vicinity of the cut surface 13. That is to say, the IC chip 50 may be positioned on one side of the conductive via 15 and the external connection pattern 22-2 may be positioned on the other side of the conductive via 15.

While FIG. 3 illustrates that the external connection pattern 22-2 is a line-shaped pattern, but the present inventive concept does not limit the shape of the external connection pattern 22-2 to that illustrated herein.

The first passivation layer 31 may be formed on the first surface 11 of the flexible film 10 to cover the first conductive pattern 21, and the second passivation layer 32 may be formed on the second surface 12 of the flexible film 10 to cover the second conductive pattern 22. The first and second passivation layers 31 and 32 may protect the first and second conductive patterns 21 and 22, respectively. The first and second passivation layers 31 and 32 may be made of, for example, solder resist, but are not limited thereto.

However, the first test pad 21-1 is not covered by the first passivation layer 31. In detail, the first passivation layer 31 has a first opening 41, which may be positioned on the first test pad 21-1 and the conductive via 15.

The external connection pattern 22-2 is not covered by the second passivation layer 32. In detail, the second passivation layer 32 has a second opening 42, which may be positioned on the external connection pattern 22-2.

A semiconductor device according to a first embodiment of the present inventive concept will be described with reference to FIG. 5. FIG. 5 is a cross-sectional view of a semiconductor device according to a first embodiment of the present inventive concept.

Referring to FIG. 5, the semiconductor device 1000 may include a flexible panel 200, a touch panel 210, a flexible printed circuit (FPC) 220, and a COF package 1. The semiconductor device 1000 may be, for example, a display device, but not limited thereto.

In detail, the touch panel 210 may be positioned on one surface of the flexible panel 200, and the FPC 220 may be positioned on the other surface of the flexible panel 200. The OLB region (II) of the second surface 12 of the COF package 1 having the external connection pattern 22-2 comes into contact with the flexible panel 200, so that the COF package 1 is electrically connected to the flexible panel 200. In addition, the first surface 11 of the COF package 1 comes into contact with the FPC 220 to be electrically connected to the FPC 220.

In a case where the external connection pattern 22-2 of the COF package 1 is formed on the second surface 12, the overall size of the semiconductor device 1000 can be advantageously reduced, compared to a case where the external connection pattern 22-2 of the COF package 1 is formed on the first surface 11. If the external connection pattern 22-2 of the COF package 1 is formed on the first surface 11 to allow the first surface 11 of the COF package 1 to come into contact with the flexible panel 200, a bent area of the COF package 1 is relatively large (i.e., thicker), thereby increasing the overall size of the semiconductor device 1000.

A semiconductor device according to a second embodiment of the present inventive concept will be described with reference to FIG. 6. However, the following description will focus on differences between the semiconductor devices according to the first and second embodiments of the present inventive concept. FIG. 6 is a cross-sectional view of a semiconductor device according to a second embodiment of the present inventive concept.

In the semiconductor device 2000, an OLB region (II) of a second surface 12 of a COF package 1 having an external connection pattern 22-2 comes into contact with a flexible panel 200, so that the COF package 1 is electrically connected to the flexible panel 200. In addition, the second surface 12 of the COF package 1 comes into contact with an FPC 220 to be electrically connected to the FPC 220.

Figure 7:
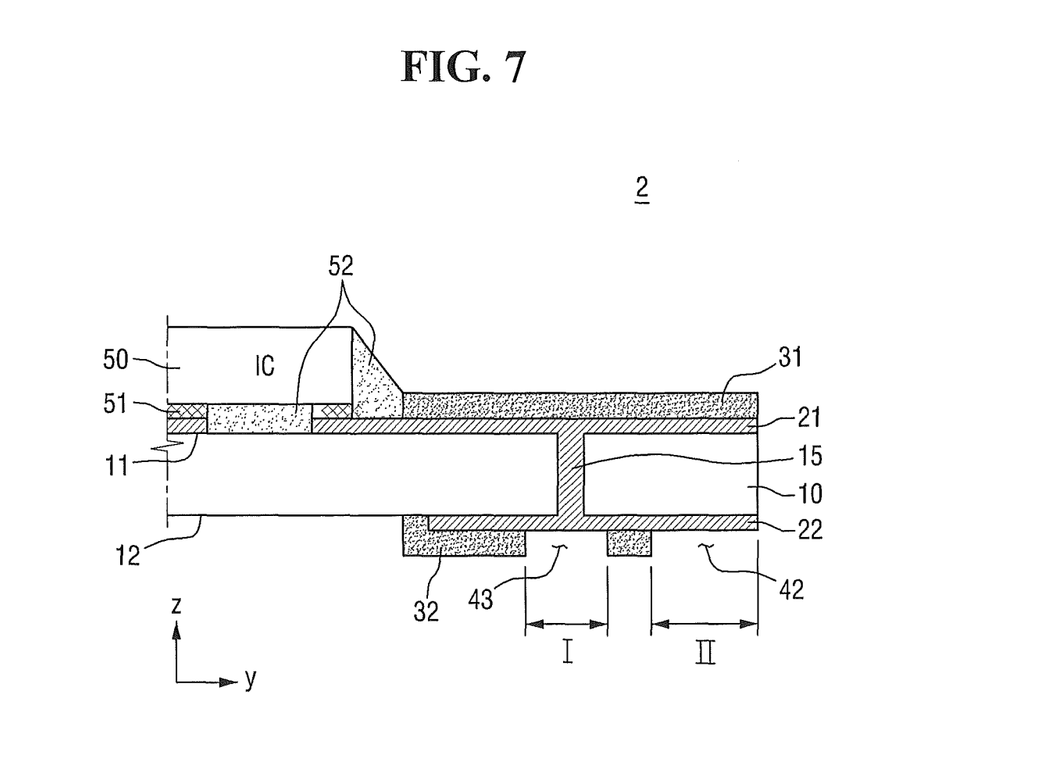
FIG. 7 is a cross-sectional view of a COF package according to a second embodiment of the present inventive concept.

A COF package according to a second embodiment of the present inventive concept will be described with reference to FIGS. 7 and 8. However, the following description will focus on differences between the COF packages according to the first and second embodiments of the present inventive concept. FIG. 7 is a cross-sectional view of a COF package according to a second embodiment of the present inventive concept and FIG. 8 is a bottom view of the COF package shown in FIG. 7.

Figure 8:
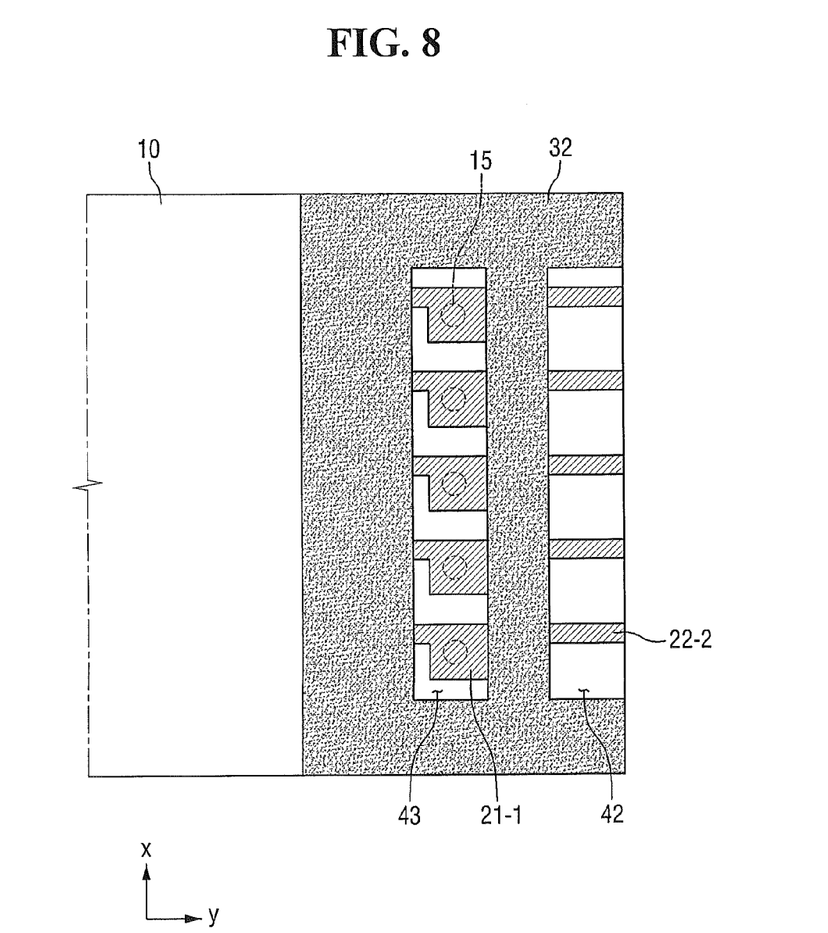
FIG. 8 is a bottom view of the COF package shown in FIG. 7.

Referring to FIGS. 7 and 8, in the COF package 2 according to the second embodiment of the present inventive concept, a second test pad 22-1 may be formed on a second surface 12 of a flexible film 10 to overlap a conductive via 15. That is to say, a test pad may be formed on the second surface 12 of the flexible film 10, rather than on a first surface 11. In addition, the second test pad 22-1 may be electrically connected to a second conductive pattern 22.

The second test pad 22-1 is not covered by the second passivation layer 32. In detail, the second passivation layer 32 has a third opening 43, which may be positioned on the second test pad 22-1.

Figure 9:
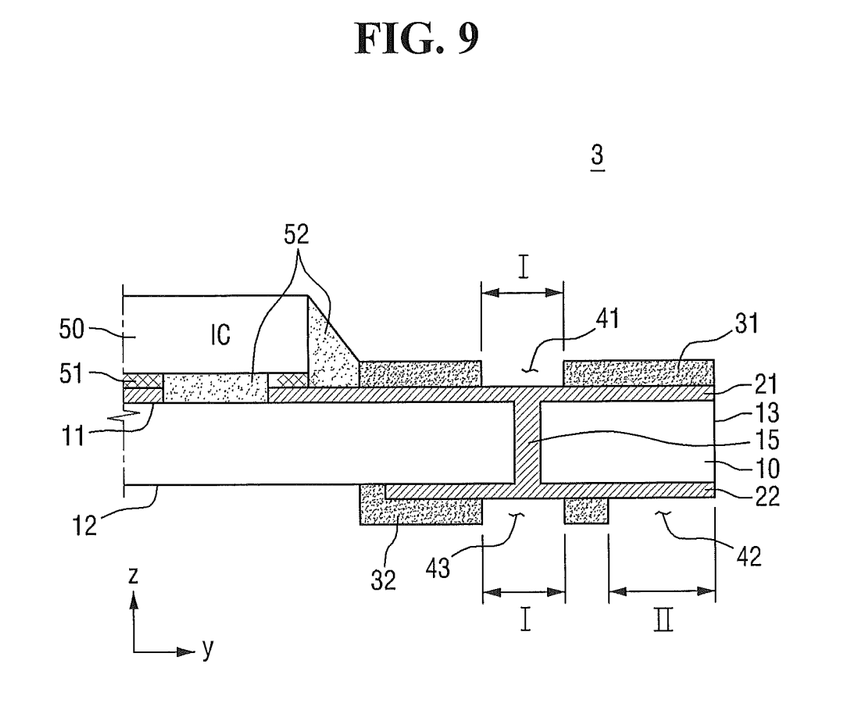
FIG. 9 is a cross-sectional view of a COF package according to a third embodiment of the present inventive concept.

A COF package according to a third embodiment of the present inventive concept will be described with reference to FIG. 9. However, the following description will focus on differences between the COF packages according to the first and third embodiments of the present inventive concept. FIG. 9 is a cross-sectional view of a COF package according to a third embodiment of the present inventive concept.

Referring to FIG. 9, the COF package 3 according to a third embodiment of the present inventive concept may include first and second test pads 21-1 and 22-1. In detail, the first test pad 21-1 may be formed on a first surface 11 of a flexible film 10 to overlap a conductive via 15. In addition, the first test pad 21-1 may be electrically connected to a first conductive pattern 21. In addition, the second test pad 22-1 may be formed on a second surface 12 of the flexible film 10 to overlap the conductive via 15. In addition, the second test pad 22-1 may be electrically connected to a second conductive pattern 22.

Figure 10:
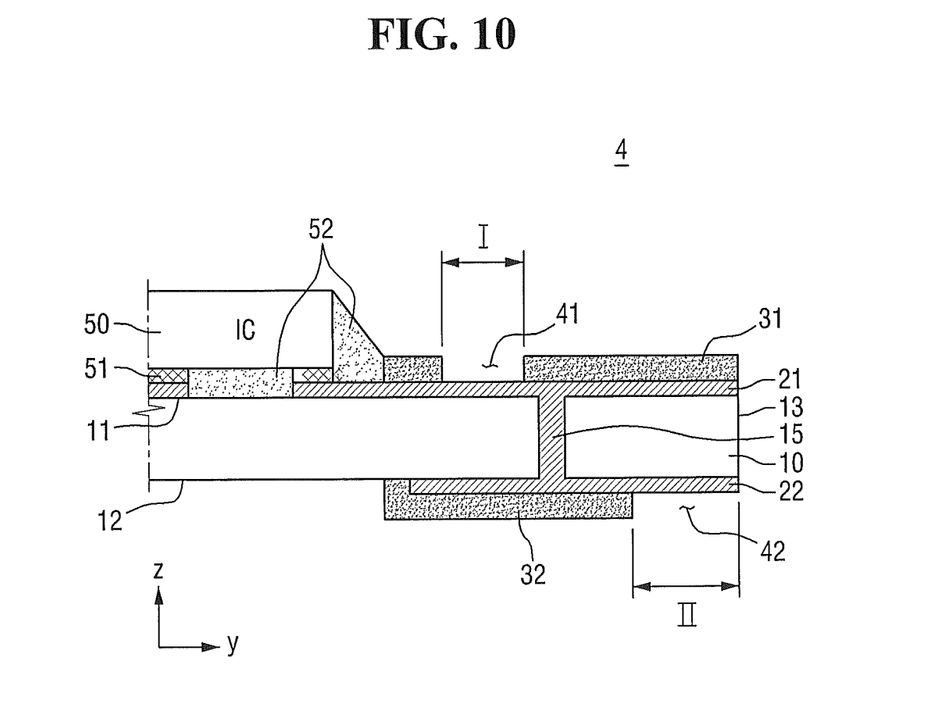
FIG. 10 is a cross-sectional view of a COF package according to a fourth embodiment of the present inventive concept.

A COF package according to a fourth embodiment of the present inventive concept will be described with reference to FIGS. 10 and 11. However, the following description will focus on differences between the COF packages according to the first and fourth embodiments of the present inventive concept. FIG. 10 is a cross-sectional view of a COF package according to a fourth embodiment of the present inventive concept, and FIG. 11 is a plan view of the COF package shown in FIG. 10.

Figure 11:
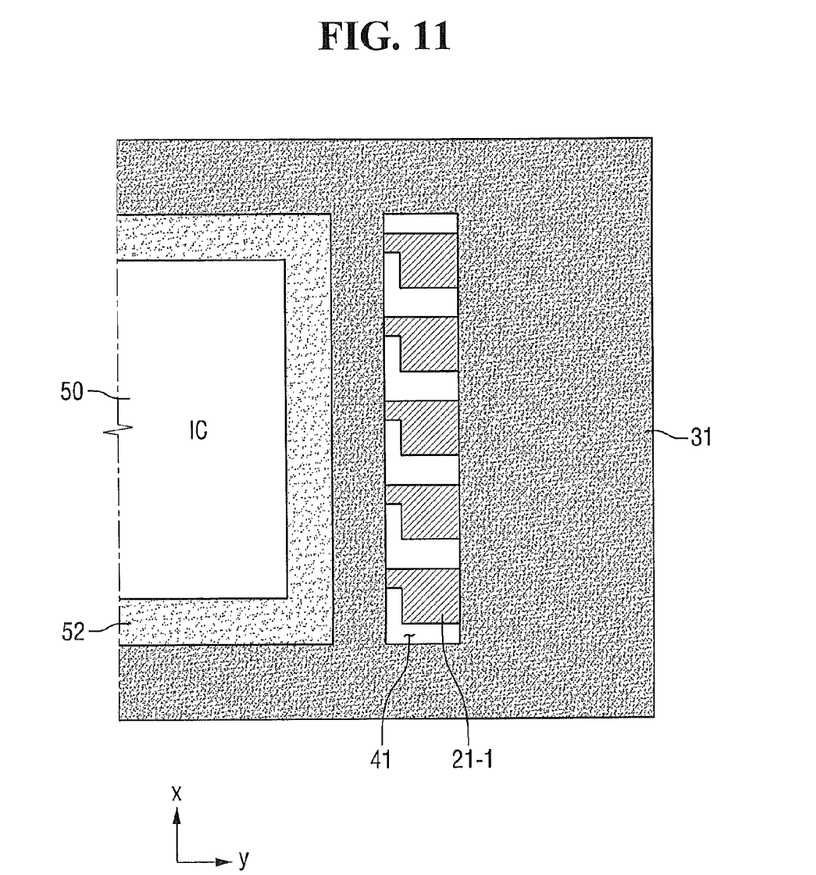
FIG. 11 is a plan view of the COF package shown in FIG. 10.

Referring to FIGS. 10 and 11, in the COF package 4 according to the fourth embodiment of the present inventive concept, a first test pad 21-1 may be formed not to overlap a conductive via 15. It will be understood, however, that the first test pad 21-1 is included on the active region between cutting lines used to separate the active region from directly adjacent active regions (such as those included in a reel-type COF roll).

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A chip on film (COF) package comprising:
    a flexible film having first and second surfaces opposite to and facing each other and including a conductive via penetrating from the first surface to the second surface;
    first and second conductive patterns on the first surface and the second surface, respectively, and electrically connected to each other through the conductive via;
    an integrated circuit (IC) chip formed on the first surface and electrically connected to the first conductive pattern;
    a test pad directly on the first conductive pattern and overlapping the conductive via;
    an external connection pattern formed on the second surface spaced apart from the conductive via and electrically connected to the second conductive pattern; and
    a first passivation layer on the first surface to cover the first conductive pattern, wherein the test pad is exposed by the first passivation layer at the conductive via.

2. The COF package of claim 1, wherein a cross-sectional area of the test pad is greater than that of the conductive via.

3. The COF package of claim 1, wherein the IC chip is positioned at one side of the test pad and the external connection pattern is positioned at the other side of the test pad.

4. The COF package of claim 1, further comprising a second passivation layer formed on the second surface to cover the second conductive pattern, wherein the external connection pattern is exposed by the second passivation layer.

5. The COF package of claim 4, wherein the test pad is on the first surface and is electrically connected to the first conductive pattern, and the first surface of the conductive via is exposed by the first passivation layer while the second surface of the conductive via is covered by the second passivation layer.

6. The COF package of claim 4, further comprising a bump including gold (Au) electrically connecting the IC chip to the first conductive pattern, wherein the flexible film comprises a polyimide (PI) film, the first and second conductive patterns comprise copper (Cu) patterns, and the first and second passivation layers comprise solder resist layers.

7. The COF package of claim 4, wherein the test pad is completely surrounded by the first passivation layer on the first conductive pattern.

8. The COF package of claim 1, wherein one surface of the flexible film comprises a cut surface and the external connection pattern formed is adjacent to the cut surface.

9. The COF package of claim 1, wherein the test pad comprises a rectangular shape and the external connection pattern comprises a line-shaped pattern.

10. The COF package of claim 1, further comprising a second test pad, wherein the second test pad is on the second surface overlapping the conductive via and is electrically connected to the second conductive pattern.

11. A chip on film (COF) package comprising:
    a flexible film having first and second surfaces opposite to and facing each other and including a conductive via penetrating from the first surface to the second surface;
    first and second conductive patterns on the first surface and the second surface, respectively, and electrically connected to each other through the conductive via;
    an integrated circuit (IC) chip formed on the first surface and electrically connected to the first conductive pattern;
    a test pad directly on the first surface and overlapping the conductive via, wherein the test pad is electrically connected to at least one of the first conductive pattern and the second conductive pattern;

an external connection pattern formed on the second surface spaced apart from the conductive via and electrically connected to the second conductive pattern; and
a first passivation layer on the first surface to cover the first conductive pattern wherein the test pad is exposed by the first passivation layer at the conductive via.

\* \* \* \* \*